(12) United States Patent
Kang et al.

(10) Patent No.: US 9,159,910 B2
(45) Date of Patent: Oct. 13, 2015

(54) ONE-MASK MTJ INTEGRATION FOR STT MRAM

(75) Inventors: Seung H. Kang, San Diego, CA (US);
David Bang, San Diego, CA (US);
Kangho Lee, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 443 days.

(21) Appl. No.: 12/355,911

(22) Filed: Jan. 19, 2009

(65) Prior Publication Data

US 2009/0261433 A1 Oct. 22, 2009

Related U.S. Application Data

(60) Provisional application No. 61/046,517, filed on Apr. 21, 2008.

(51) Int. Cl.
*H01L 21/00* (2006.01)
*H01L 43/12* (2006.01)
*H01L 43/08* (2006.01)
*H01L 27/22* (2006.01)

(52) U.S. Cl.
CPC .............. *H01L 43/12* (2013.01); *H01L 43/08* (2013.01); *H01L 27/228* (2013.01)

(58) Field of Classification Search
USPC .................. 257/421, 422, E21.002, E29.323; 438/3; 365/51, 66, 158, 171–173, 203; 360/324.2
See application file for complete search history.

(56) References Cited

U.S. PATENT DOCUMENTS

| | | | |
|---|---|---|---|
| 6,657,270 B2 * | 12/2003 | Kim et al. | 257/423 |
| 6,806,096 B1 * | 10/2004 | Kim et al. | 438/3 |
| 7,122,386 B1 | 10/2006 | Torng et al. | |
| 7,381,574 B2 | 6/2008 | Kim et al. | |
| 7,541,199 B2 | 6/2009 | Bae et al. | |
| 7,582,941 B2 | 9/2009 | Cho et al. | |
| 2003/0170985 A1 | 9/2003 | Hwang et al. | |
| 2006/0027846 A1 | 2/2006 | Lee et al. | |
| 2007/0023806 A1 | 2/2007 | Gaidis et al. | |
| 2007/0120210 A1 | 5/2007 | Yuan et al. | |

(Continued)

FOREIGN PATENT DOCUMENTS

| | | |
|---|---|---|
| CN | 1921004 A | 2/2007 |
| JP | 2004274016 A | 9/2004 |

(Continued)

OTHER PUBLICATIONS

International Search Report—PCT/US09/040823, International Search Authority—European Patent Office—Jul. 17, 2009.

(Continued)

*Primary Examiner* — Meiya Li
(74) *Attorney, Agent, or Firm* — Chui-kiu Teresa Wong; Paul Holdaway

(57) ABSTRACT

A method for integrating a magnetic tunnel junction (MTJ) device into an integrated circuit includes providing in a semiconductor back-end-of-line (BEOL) process flow a substrate having a first interlevel dielectric layer and at least a first metal interconnect. Over the first interlevel dielectric layer and the first metal interconnect, magnetic tunnel junction material layers are deposited. From the material layers a magnetic tunnel junction stack, coupled to the first metal interconnect, is defined using a single mask process. The magnetic tunnel junction stack is integrated into the integrated circuit.

13 Claims, 6 Drawing Sheets

(56) References Cited

U.S. PATENT DOCUMENTS

2007/0164265 A1   7/2007  Kajiyama
2007/0164381 A1   7/2007  Ho et al.
2008/0316657 A1*  12/2008 Zhang et al. ............. 360/324.11

FOREIGN PATENT DOCUMENTS

| JP | 2004319725 A | 11/2004 |
|---|---|---|
| JP | 2005109470 A | 4/2005 |
| JP | 2006054458 A | 2/2006 |
| JP | 2007158336 A | 6/2007 |
| KR | 20060109718 A | 10/2006 |
| KR | 100655438 B1 | 12/2006 |
| WO | 03077287 | 9/2003 |

OTHER PUBLICATIONS

Written Opinion—PCT/US09/040823, International Search Authority—European Patent Office—Jul. 17, 2009.
Taiwan Search Report—TW098113236—TIPO—Mar. 28, 2013.

* cited by examiner

ONE-MASK MTJ INTEGRATION FOR STT MRAM

CROSS REFERENCE TO RELATED APPLICATION

This application claims priority to provisional application No. 61/046,517, entitled "ONE-MASK MTJ INTEGRATION FOR STT MRAM," by Seung H. Kang, et al., filed Apr. 21, 2008, which is expressly incorporated herein by reference in its entirety.

TECHNICAL FIELD

This disclosure relates to integrated electronic circuitry, and in particular, to spin transfer torque (STT) magnetic random access memory (MRAM) and methods of integration with standard integrated circuitry.

BACKGROUND

Unlike conventional random access memory (RAM) chip technologies, in magnetic RAM (MRAM) data is not stored as electric charge, but by magnetic polarization of storage elements. The elements are formed from two magnetically polarized plates, each of which can maintain a magnetic polarization field, separated by a thin insulating layer, which together form a magnetic tunnel junction (MTJ). One of the two plates is a permanent magnet (hereinafter "fixed layer") set to a particular polarity; the polarization of the other plate (hereinafter "free layer") will change to match that of a sufficiently strong external field. A memory device may be built from a grid of such "cells".

Reading the polarization state of an MRAM cell is accomplished by measuring the electrical resistance of the cell's MTJ. A particular cell is (conventionally) selected by powering an associated transistor which switches current from a supply line through the MTJ to a ground. Due to the tunneling magnetoresistance effect, the electrical resistance of the cell changes due to the relative orientation of the polarizations in the two magnetic layers of the MTJ. By measuring the resulting current, the resistance inside any particular cell can be determined, and from this the polarity of the free writable layer determined. If the two layers have the same polarization, this is considered to mean State "0", and the resistance is "low," while if the two layers are of opposite polarization the resistance will be higher and this means State "1".

Data is written to the cells using a variety of schemes. In conventional MRAM, an external magnetic field is provided by current in a wire in proximity to the cell, which is strong enough to align the free layer.

Spin-transfer-torque (STT) MRAM uses spin-aligned ("polarized") electrons to directly torque the domains of the free layer. The current to write to the cells through this mechanism is less than the write current for conventional MRAM. Furthermore, no external magnetic field is required, so that adjacent cells are substantially unaffected by stray fields. This write current further decreases as the memory cell size scales down, which is a critical benefit as the semiconductor technology continues to scale to higher device pitch density.

One significant determinant of a memory system's cost is the density of the components on the chip. Smaller components, and fewer components per "cell," mean that more "cells" may be packed onto a single chip, which in turn means more chips can be produced at once from a single semiconductor wafer and fabricated at lower cost and improved yield.

In addition, the manufacturing process flow affects cost, with more mask processes contributing to increased overall manufacturing costs. When fabrication of conventional MRAM requires a number of mask processes dedicated solely to the fabrication of the magnetic tunnel junction (MTJ) structure, costs are further increased. Because processing cost is a serious consideration in implementing integration of features in an integrated circuit device, any improvement in the design and process flow that eliminates masks and associated processes is advantageous. A difference in one mask process can save significant costs. Accordingly, there is a need for improved methods for integrating MRAM fabrication in the semiconductor manufacturing process flow. Moreover, any design that relaxes alignment of critical dimension features would be desirable.

SUMMARY

A method of integrating fabrication processes and a structure of a magnetic random access memory (MRAM) magnetic tunnel junction (MTJ) into standard back-end-of-line (BEOL) integrated circuit manufacturing includes a single photo mask.

In an aspect, a method integrates a magnetic tunnel junction (MTJ) device into an integrated circuit. The method includes providing in a semiconductor back-end-of-line (BEOL) process flow a substrate having a first interlevel dielectric layer and at least a first metal interconnect. The method also includes depositing over the first interlevel dielectric layer and the first metal interconnect multiple magnetic tunnel junction material layers. The method further includes defining from the material layers a magnetic tunnel junction stack coupled to the first metal interconnect using a single mask process. The magnetic tunnel junction stack is integrated into the integrated circuit.

In another aspect, a magnetic tunnel junction device is in an integrated circuit (IC) including at least a magnetic random access memory (MRAM). The device includes a substrate having a first metal interconnect; as well as a magnetic tunnel junction stack communicating with the first metal interconnect. The magnetic tunnel junction stack was defined using a single mask process. The device also includes a second metal interconnect in communication with the magnetic tunnel junction stack. The magnetic tunnel device is integrated into the IC.

In yet another aspect, a magnetic tunnel junction (MTJ) structure for magnetic random access memory (MRAM) includes a first interconnect means for communicating with at least one control device; and a first electrode means for coupling to the first interconnect means. The device also includes an MTJ means for storing data, and a second electrode means for coupling to the MTJ means. The MTJ means couples to the first electrode means. The first and second electrode means have a same lateral dimension as the MTJ means based upon a first mask. The device further includes a second interconnect means for coupling to the second electrode means and at least one other control device.

The foregoing has outlined rather broadly the features and technical advantages of the present disclosure in order that the detailed description of embodiments of the disclosure that follows may be better understood. Additional features and advantages of the embodiments will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the spirit and scope of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

DESCRIPTION OF FIGURES

For a more complete understanding of the present disclosure, reference is now made to the following descriptions taken in conjunction with the accompanying drawings.

DETAILED DESCRIPTION

A magnetic tunnel junction (MTJ) device and method of forming the same include a single photomask process. In one embodiment, the MTJ and method of forming pertain to MRAM. In another embodiment, the MTJ and method of forming can pertain to spin-torque-transfer (STT) MRAM.

A method of making and a structure for a magnetic tunnel junction device for MRAM based on a single mask process may be imbedded within a back-end-of-line (BEOL) process flow in order to integrate MRAM memory including, but not limited to, STT MRAM, in standard semiconductor processes. Additional other masks and processes, such as may be used to define elements for interconnection to the disclosed device may be a part of the BEOL process flow.

Figure 1:
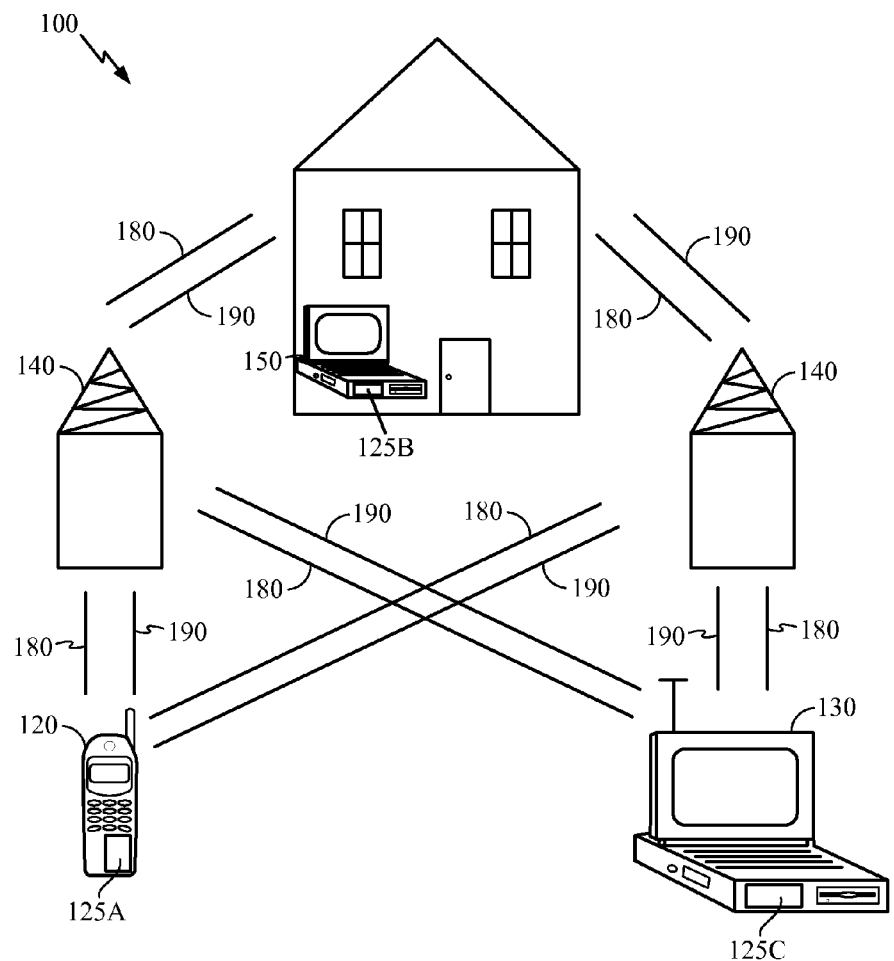
FIG. 1 shows an exemplary wireless communication system in which embodiments of the disclosure may be advantageously employed.

FIG. 1 shows an exemplary wireless communication system 100 in which an embodiment of the disclosure may be advantageously employed. For purposes of illustration, FIG. 1 shows three remote units 120, 130, and 150 and two base stations 140. It will be recognized that conventional wireless communication systems may have many more remote units and base stations. Remote units 120, 130, and 150 include MRAM and/or STT MRAM memory devices 125A, 125B and 125C, which are embodiments of the disclosure as discussed further below. FIG. 1 shows forward link signals 180 from the base stations 140 and the remote units 120, 130, and 150 and reverse link signals 190 from the remote units 120, 130, and 150 to base stations 140.

In FIG. 1, remote unit 120 is shown as a mobile telephone, remote unit 130 is shown as a portable computer, and remote unit 150 is shown as a fixed location remote unit in a wireless local loop system. For example, the remote units may be mobile phones, hand-held personal communication systems (PCS) units, portable data units such as personal data assistants, navigation devices (e.g., GPS enabled devices,) set-top boxes, music players, video players, entertainment units, fixed location data units such as meter reading equipment, or any other device that stores or retrieves data or computer instructions, or any combination thereof. Although FIG. 1 illustrates remote units according to the teachings of the disclosure, the disclosure is not limited to these exemplary illustrated units. Embodiments of the disclosure may be suitably employed in any device which includes a magnetic memory.

Figure 2:
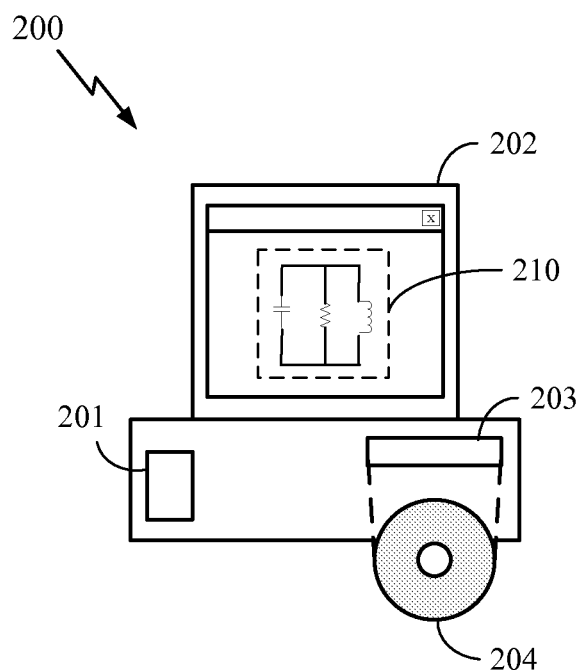
FIG. 2 is a block diagram illustrating a design workstation used for circuit, layout, logic design and integration of MRAM in a semiconductor back-end-of-line (BEOL) process flow, in accordance with an embodiment of the disclosure.

FIG. 2 is a block diagram illustrating a design workstation used for circuit, layout, and logic design of the disclosed semiconductor integrated circuit. A design workstation 200 includes a hard disk 201 containing operating system software, support files, and design software such as CADENCE or ORCAD. The design workstation 200 also includes a display 202 to facilitate design of a circuit design 210. The circuit design 210 may be the memory circuit as disclosed above. A storage medium 204 is provided for tangibly storing the circuit design 210. The circuit design 210 may be stored on the storage medium 204 in a file format such as GDSII or GERBER. The storage medium 204 may be a CD-ROM, DVD, hard disk, flash memory, or other appropriate device. Furthermore, the design workstation 200 includes a drive apparatus 203 for accepting input from or writing output to the storage medium 204.

Data recorded on the storage medium 204 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 204 facilitates the design of the circuit design 210 by decreasing the number of processes for designing semiconductor ICs.

In this disclosure a device and a method of making MRAM devices within a BEOL process are provided that utilizes only one mask to form an MTJ. This enables a potentially large reduction in the cost of imbedding memory in an integrated circuit product.

Figure 3:
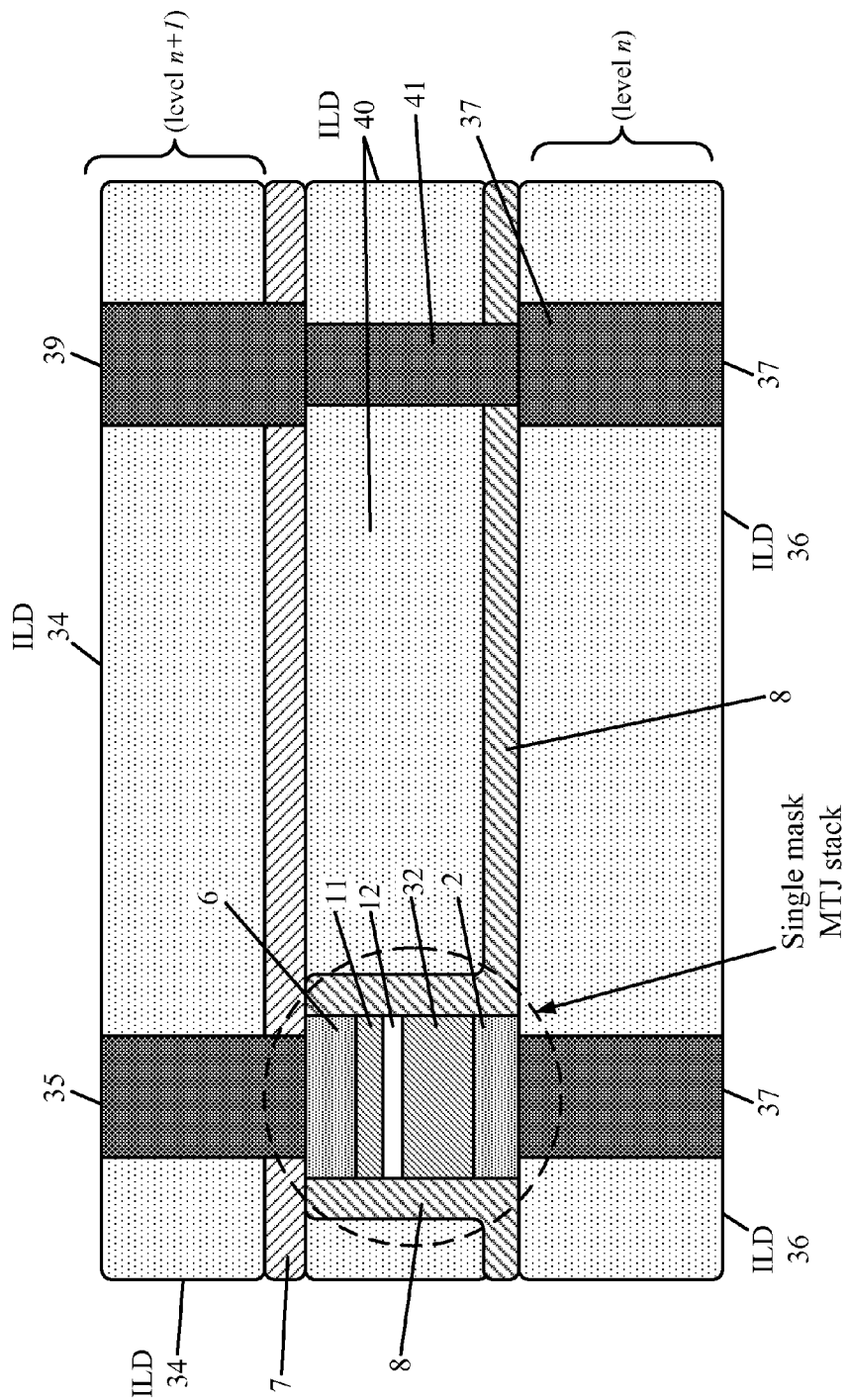
FIG. 3 is a cross section view showing an embodiment of an MTJ structure defined with a single mask process.

FIG. 3 is a cross-section of a magnetic tunnel junction device fabricated with a single mask process embedded in a current back-end-of-line (BEOL) process. The formation of the MTJ stack is compatible with standard back-end-of-line (BEOL) process flows. The MTJ stack formation occurs after transistor fabrication, which is commonly referred to as a front-end-of-line (FEOL) process flow.

In terms of structure, the MTJ device has all the same layers required to provide MTJ functionality, and uses the same materials as a conventional MTJ device. However, the process is simplified compared to the processes required to fabricate the conventional MTJ device, which may rely on more masks and processes.

Referring to FIG. 3, an MTJ stack is formed over a planarized surface that includes a first metal interconnect 37 and a first interlevel dielectric (ILD) 36. The stack includes a first electrode 2, a fixed magnetization reference layer 32, a tunnel barrier 12, a free layer 11, and a second electrode 6. In one embodiment, the fixed magnetization reference layer 32 includes a fixed antiferromagnetic layer and a synthetic antiferromagnetic layer, neither of which are shown.

A conventional dielectric barrier between the first ILD 36 and the first contact layer 2 is absent. To compensate for the loss of the conventional dielectric barrier, the first electrode 2 may be a refractory metal such as, for example, tantalum (Ta). The first metal interconnect 37 may commonly be copper, and tantalum may be used as an excellent barrier material for blocking diffusion of copper into adjacent layers. In other words, tantalum blocks diffusion of metals, such as copper, from the first metal interconnect 37, eliminating the need for the conventional dielectric barrier. Additionally, depositing a tantalum layer on top of the first ILD 36 and first metal interconnect 37 is a process friendly integration scheme common to complementary metal oxide semiconductor (CMOS). The second electrode 6 may be the same material as the first electrode 2, but is not limited to such material.

The stack and the first ILD 36 are protected by a deposited first dielectric passivation barrier 8. A second ILD 40 is also deposited to sufficiently fill in the surrounding area. When the first dielectric passivation barrier 8 and second ILD 40 are planarized, the second electrode 6 is exposed.

The second ILD 40 may also contain a metal via 41 to connect one of the first metal interconnects 37 (in level n (on the right side of the figure)) with a second metal interconnect 39 (in level n+1). In one embodiment, forming such "bypass" via is a part of the BEOL process flow, and does not impact the formation of the MTJ structure.

A second dielectric passivation barrier 7 and a third ILD 34 can then be deposited over the planarized surface. A third metal interconnect 35 may be formed in the second dielectric passivation barrier 7 and the third ILD 34 to connect the electrode 6 of the stack to circuitry that may be later formed above the third ILD 34. The second metal interconnect 39 can be formed in the second dielectric passivation barrier 7 and the third ILD 34 to connect the "bypass" via 41 to circuitry that may be later formed above the third ILD 34. In one embodiment, the third metal interconnect 35 is a bit line interconnect and the first metal interconnect 37 links an MTJ to a source line through an access transistor.

The second dielectric passivation barrier 7 and the first dielectric barrier 8 may be formed from dense insulating materials such as, for example, SiC or SiN. The first and second electrodes 2 and 6 may he formed from refractory metals such as tantalum, as previously mentioned. The first metal interconnect 37, second metal interconnect 39 and third metal interconnect 35 may be formed from metals such as copper or other low resistivity metals.

Small dimensions present a challenge when aligning the single MTJ stack formed by the one mask with the first metal interconnect 37 and the third metal interconnect 35. However, successfully aligning to a critical dimension in a single mask process enables a potentially significant reduction in process costs relative to process with multiple masks. In various embodiments, the dimensions of the first metal interconnect 37 and third metal interconnect 35 may be smaller, the same or greater than the dimensions of the MTJ stack. In the case where the first metal interconnect 37 and third metal interconnect 35 are larger, the alignment critical dimension is substantially moot.

Figure 4:
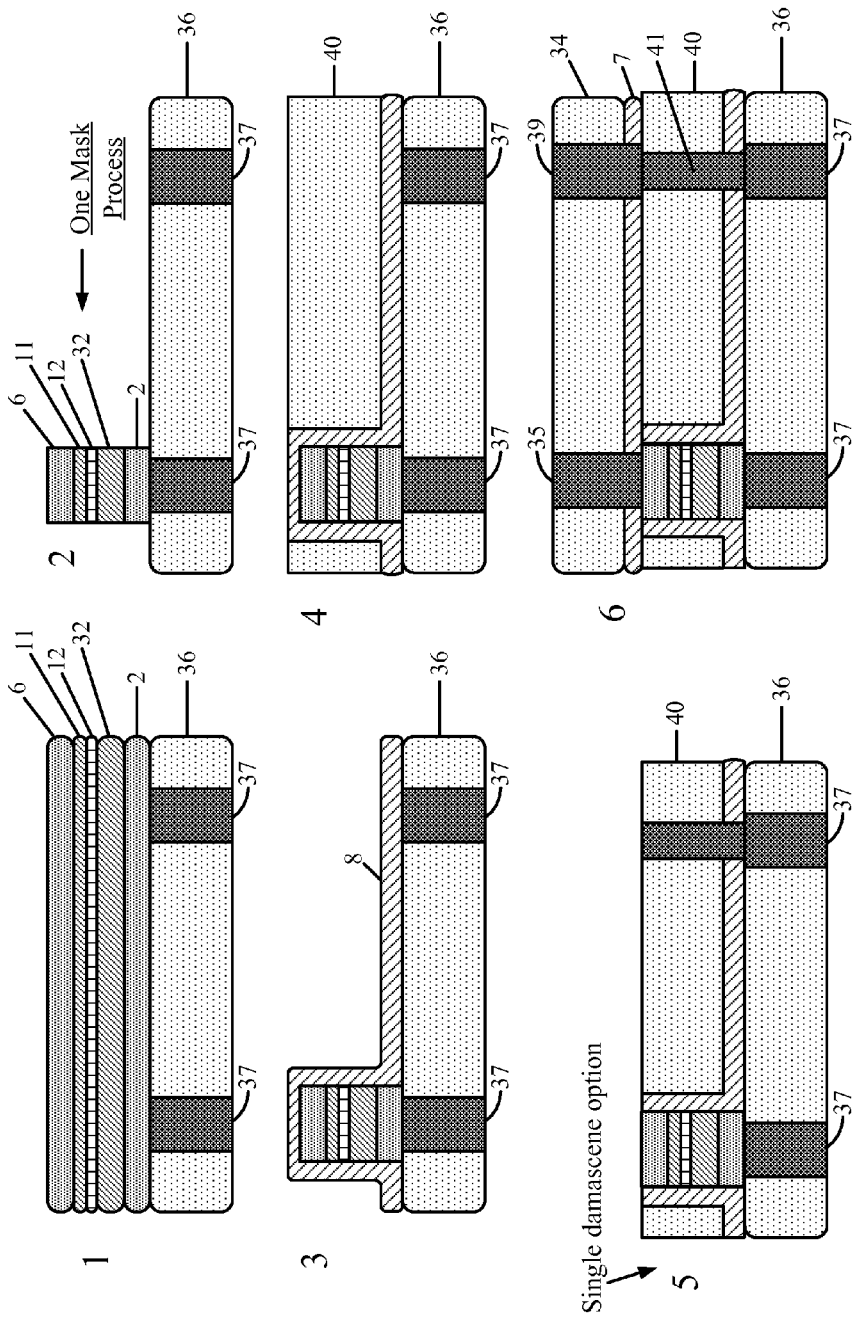
FIG. 4 is a schematic process flow for forming an MTJ structure that may be imbedded in a single damascene semiconductor back-end-of-line (BEOL) process flow, according to an embodiment of the disclosure.

FIG. 4 shows a schematic process flow for forming an MTJ device that may be imbedded in a single damascene semiconductor BEOL process flow, according to an embodiment of the disclosure.

Process 1: Beginning with a planarized surface that includes the metal interconnect 37 and the first ILD 36, a succession of layers are disposed on the surface, including material for the first electrode 2, the magnetic reference layer 32, the tunnel barrier layer 12, the magnetic free layer 11, and the second electrode 6. It is noted that no dielectric barrier layer is present between the first electrode 2 and the layer including the metal interconnect 37 and the first ILD 36.

As seen in process 2, a single mask is used to define the shape and fabricate a stack of magnetic tunnel junction films by etching the layers 6, 11, 12, 32 and 2 which were deposited, as described above.

In process 3, the dielectric passivation barrier 8 is disposed over the entire surface, including the MTJ stack, the ILD 36 and the metal interconnect 37. The dielectric passivation layer 8 protects the components and can also act as an etch stop for future etching.

Process 4: The ILD layer 40 is deposited and encapsulates the device level containing the MTJ stack. The ILD 40 both encapsulates the MTJ stack and the passivation barrier 8 and provides structure for formation of "bypass" metal-filled vias, such as the via 41 to connect circuitry, e.g., between components in a BEOL level on one side of the MTJ stack (e.g., level n), and components in a BEOL level on the other side of the MTJ stack (e.g., level n+1), in the process flow, as indicated in FIG. 3.

Process 5: A portion of the ILD 40 and a portion of passivation barrier 8 may be removed by planarization to level and expose the second electrode 6 and the via 41 provided within the ILD 40. Alternatively, the via 41 may be deposited after planarization. In other words a hole is created in the ILD 40 and the hole is then filled to form the via 41. Further planarization levels the via 41.

Process 6: A dielectric passivation barrier 7 is deposited and an ILD 34 is deposited over the dielectric passivation barrier 7. Metal interconnect 35 is formed in the dielectric passivation barrier 7 and the ILD 34 to contact the second electrode 6 and metal interconnect 39 is formed to couple to the via 41 between the two adjacent BEOL levels (i.e., between the level including the metal interconnect 37 and the level including the metal interconnects 35 and 39).

Figure 5:
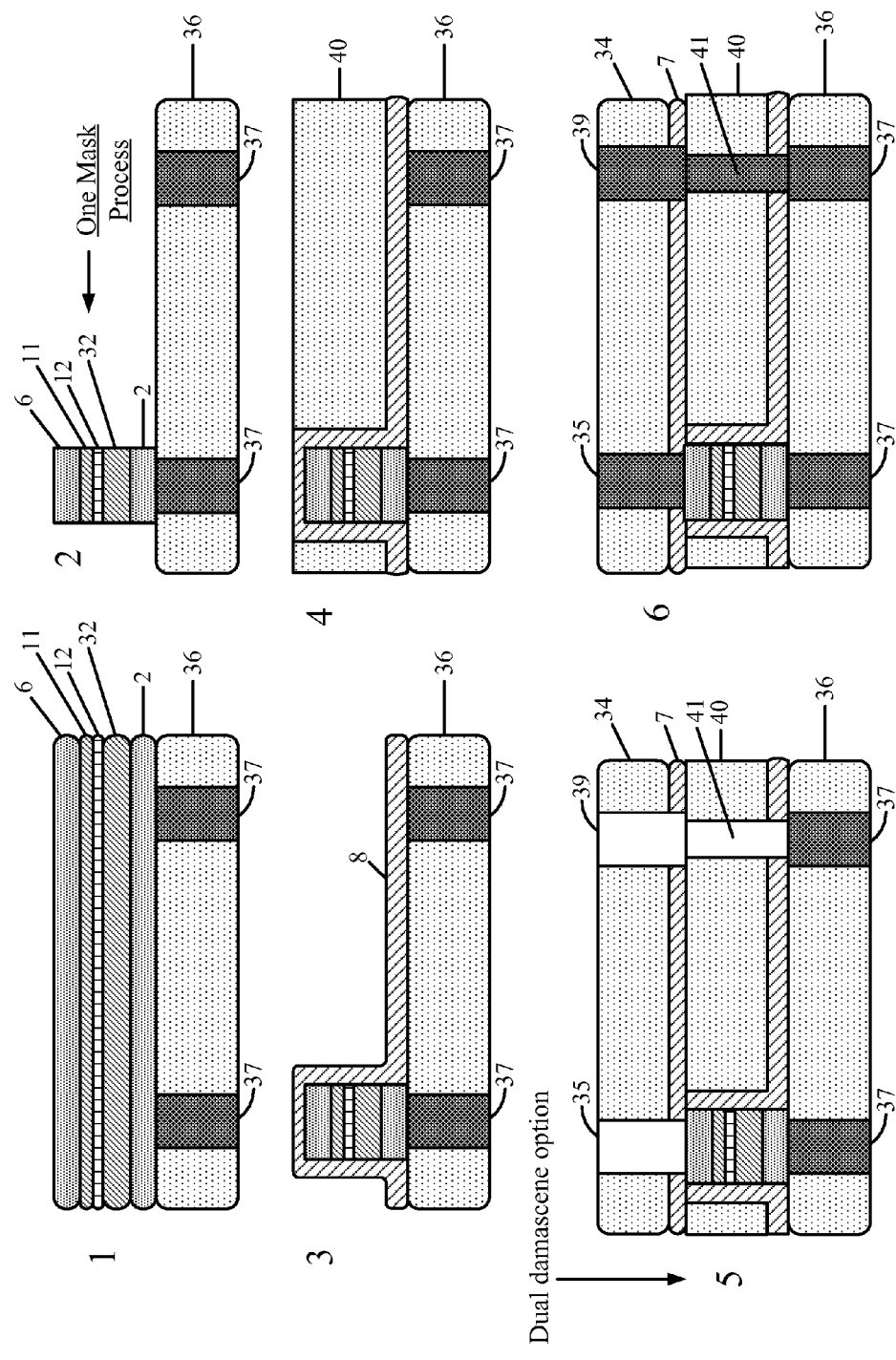
FIG. 5 is a schematic process flow for forming an MTJ structure that may be imbedded in a dual damascene semiconductor back-end-of-line (BEOL) process flow, according to an embodiment of the disclosure.

The processes shown in FIG. 4 illustrate an example when using a single damascene semiconductor BEOL process. Description will now be provided of a dual damascene semiconductor BEOL process, according to another embodiment of the disclosure. Processes 1-4 in FIG. 5 are identical to processes 1-4 in FIG. 4. Process 5 for the dual damascene embodiment differs in that the trenches to be filled with metal to form the metal interconnects 35 and 39 and the bypass via 41 are formed first. Subsequently, metal is deposited into the trenches in the ILD 34, the dielectric passivation barrier 7 and the ILD 40 at the same time. The structure resulting from the dual damascene process (as shown in FIG. 5, process 6) is identical to the structure resulting from the single damascene process (as shown in process 6 of FIG. 4).

Figure 6A:
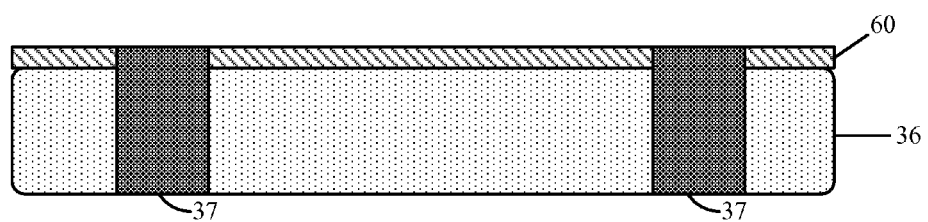
FIGS. 6A and 6B are cross section views showing a dielectric barrier on a substrate, and an intermediate structure for forming an MTJ structure including a dielectric barrier, respectively, according to another embodiment of the disclosure.
Figure 6B:
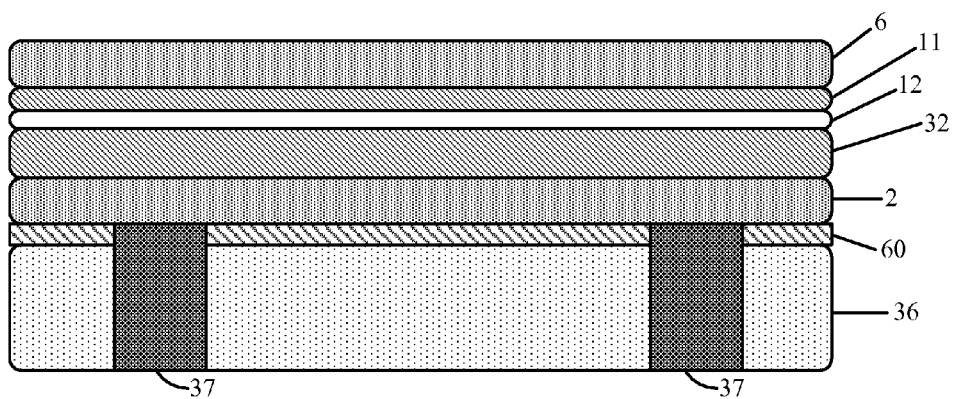

FIG. 6A shows another embodiment, in which a barrier layer 60 is formed over the ILD 36, prior to fabricating the metal interconnect 37. The barrier layer 60 acts as an etch stop and as a barrier to protect the ILD 36. As seen in FIG. 6B, in this embodiment the MTJ material layers 2, 32, 12, 11, 6 are deposited over the barrier 60 in the first MTJ fabrication process. The MTJ integration processes may then proceed as described above.

An advantage of the methods and devices described above is that the single mask MTJ process is compatible with and can be integrated with both single and dual damascene processes, both of which are common to BEOL process flows in integrated circuit manufacturing. A single mask process reduces fabrication costs and complexity relative to conventional MTJ fabrication. The entire MTJ can be formed with the same dimension as the first electrode 2, enabling a tighter device pitch and lower contact resistance. Where the dimensions of the MTJ stack and the metallization interconnects 37 and/or 35 are appropriately chosen, critical dimension alignment criteria may be eased.

Where the MTJ device is for STT MRAM, the device is scalable to smaller dimensions. The compatibility with nanoscale fabrication enables lower cost and higher device density fabrication of STT MRAM memory chips with scaling.

MRAM as set forth in the disclosure may operate with logic circuitry such as microprocessors. The MRAM may be integrated into devices that employ the microprocessors. For example, the MRAM may be part of a communications device. Of course the MRAM may include other types of circuitry without departing from the scope and spirit of the disclosure.

Although the embodiments of the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for integrating a magnetic tunnel junction (MTJ) device into an integrated circuit comprising:
providing in a semiconductor process flow a substrate having a first interlevel dielectric layer and a first metal interconnect extending through a top surface and a bottom surface of the first interlevel dielectric layer;
depositing on the first interlevel dielectric layer and the first metal interconnect a magnetic tunnel junction structure, the magnetic tunnel junction structure including a plurality of MTJ material layers and a first electrode layer, the first electrode layer deposited directly on the first metal interconnect and on the first interlevel dielectric layer;
defining from all of the magnetic tunnel junction structure a magnetic tunnel junction stack coupled to the first metal interconnect using only a single mask process, the magnetic tunnel junction stack being integrated into the integrated circuit; and
depositing a first dielectric passivation barrier layer on the magnetic tunnel junction stack and directly on the first interlevel dielectric layer.

2. The method of claim 1, further comprising continuing the process flow to provide a second metal interconnect in communication with the magnetic tunnel junction stack.

3. The method of claim 1, in which depositing the magnetic tunnel junction structure comprises:
depositing the first electrode layer on the first metal interconnect;
depositing the plurality of MTJ material layers on the first electrode layer; and
depositing a second electrode layer on the MTJ material layers.

4. The method of claim 3, wherein the depositing the plurality of MTJ material layers comprises:
depositing a fixed magnetization layer on the first electrode layer;
depositing a tunnel barrier layer on the fixed magnetization layer; and
depositing a free magnetization layer on the tunnel barrier layer.

5. The method of claim 3, further comprising:
depositing a second interlevel dielectric layer on the first dielectric passivation barrier layer; and
planarizing the second interlevel dielectric layer and the first dielectric passivation barrier layer to expose the second electrode layer.

6. The method of claim 5, further comprising:
depositing a second dielectric passivation barrier layer on the second interlevel dielectric layer and the second electrode layer;
depositing a third interlevel dielectric layer on the second dielectric passivation barrier layer; and
forming a second metal interconnect in the third interlevel dielectric layer and the second dielectric passivation barrier layer, the second metal interconnect being in communication with the second electrode layer.

7. The method of claim 1, further comprising forming a third metal interconnect in the first interlevel dielectric layer positioned apart from the magnetic tunnel junction stack, the third metal interconnect being formed before depositing the plurality of MTJ material layers.

8. The method of claim 7, further comprising:
depositing a second interlevel dielectric layer on the first dielectric passivation barrier layer;
forming a conductive via in the second interlevel dielectric layer and the first dielectric passivation barrier layer positioned to communicate with the third metal interconnect;
depositing a second dielectric passivation barrier layer on the second interlevel dielectric layer;
depositing a third interlevel dielectric layer on the second dielectric passivation barrier layer; and
forming a fourth metal interconnect in the third interlevel dielectric layer and the second dielectric passivation barrier layer, the fourth metal interconnect communicating with the conductive via.

9. The method of claim 8, wherein the conductive via is formed after the depositing of the second interlevel dielectric layer and before the depositing of the second dielectric passivation barrier layer, and the fourth metal interconnect is formed after the depositing of the second dielectric passivation barrier layer and the third interlevel dielectric layer in a single damascene process.

10. The method of claim 8, wherein the conductive via and the fourth metal interconnect are formed after the depositing of the third interlevel dielectric layer and the second dielectric passivation barrier layer in a dual damascene process.

11. The method of claim 1, wherein the integrated circuit is applied in an electronic device, selected from a group consisting of a set top box, music player, video player, entertainment unit, navigation device, communications device, personal digital assistant (PDA), fixed location data unit, and a computer, into which the integrated circuit is integrated.

12. A method for integrating a magnetic tunnel junction (MTJ) device into an integrated circuit comprising steps of:
providing in a semiconductor process flow a substrate having a first interlevel dielectric layer and a first metal interconnect extending through a top surface and a bottom surface of the first interlevel dielectric layer;

depositing on the first interlevel dielectric layer and the first metal interconnect a magnetic tunnel junction structure, the magnetic tunnel junction structure including a plurality of MTJ material layers and a first electrode layer, the first electrode layer deposited directly on the first metal interconnect and on the first interlevel dielectric layer;

defining from all of the magnetic tunnel junction structure a magnetic tunnel junction stack coupled to the first metal interconnect using only a single mask process, the magnetic tunnel junction stack being integrated into the integrated circuit; and depositing a first dielectric passivation barrier laver on the magnetic tunnel junction stack and directly on the first interlevel dielectric layer.

13. The method of claim 12, wherein the integrated circuit is applied in an electronic device, selected from a group consisting of a set top box, music player, video player, entertainment unit, navigation device, communications device, personal digital assistant (PDA), fixed location data. unit, and a computer, into which the integrated circuit is integrated.

* * * * *